United States Patent
Endo

(10) Patent No.: US 9,621,024 B2
(45) Date of Patent: Apr. 11, 2017

(54) POWER SUPPLY DEVICE SUPPLYING LIMITED DC POWER TO LOAD BASED ON GROUND FAULT DETECTION

(71) Applicant: DENSO CORPORATION, Kariya, Aichi-pref. (JP)

(72) Inventor: Susumu Endo, Chiryu (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 14/766,152

(22) PCT Filed: Jan. 10, 2014

(86) PCT No.: PCT/JP2014/000073
§ 371 (c)(1),
(2) Date: Aug. 6, 2015

(87) PCT Pub. No.: WO2014/125756
PCT Pub. Date: Aug. 21, 2014

(65) Prior Publication Data
US 2015/0381030 A1 Dec. 31, 2015

(30) Foreign Application Priority Data
Feb. 12, 2013 (JP) .................. 2013-024853

(51) Int. Cl.
*H02M 1/32* (2007.01)
*H02H 3/16* (2006.01)
(Continued)

(52) U.S. Cl.
CPC ............ *H02M 1/32* (2013.01); *H02H 3/16* (2013.01); *H02H 9/08* (2013.01); *H02M 3/00* (2013.01);
(Continued)

(58) Field of Classification Search
CPC ........................................ H02M 1/32
See application file for complete search history.

(56) References Cited

U.S. PATENT DOCUMENTS 5,177,657 A * 1/1993 Baer .............. H02H 3/331
361/114
2002/0125837 A1 9/2002 Noda
(Continued)

FOREIGN PATENT DOCUMENTS

EP 2 200 406 A2 6/2010
JP 2004-325382 A 11/2004
(Continued)

OTHER PUBLICATIONS

International Search Report and Written Opinion of the International Searching Authority dated Apr. 15, 2014 issued in the corresponding International application No. PCT/JP2014/000073 (and English translation).

*Primary Examiner* — Emily P Pham
(74) *Attorney, Agent, or Firm* — Posz Law Group, PLC

(57) ABSTRACT

A power supply device supplies DC power to a load and includes: a shunt resistor connected in series to a low-potential side of the load; a power supply control device for controlling a power supply state to the load according to an amount of a voltage drop across the shunt resistor; a ground fault detection element connected in series to the low-potential side of the load to cause a voltage drop; and a limiting device for limiting a supply of power by the power supply control device by determining that a ground fault occurs in a case where an amount of a voltage drop, which occurs when a detection current flows through the ground fault detection element, is less than a predetermined threshold.

19 Claims, 10 Drawing Sheets

(51) Int. Cl.
   *H02M 3/00* (2006.01)
   *H05B 33/08* (2006.01)
   *H02H 9/08* (2006.01)
   *B60Q 11/00* (2006.01)
   *G01R 31/40* (2014.01)
   *G01R 31/02* (2006.01)

(52) U.S. Cl.
   CPC ..... *H05B 33/0815* (2013.01); *H05B 33/0884* (2013.01); *B60Q 11/00* (2013.01); *G01R 31/025* (2013.01); *G01R 31/40* (2013.01)

(56) References Cited

U.S. PATENT DOCUMENTS

| | | | |
|---|---|---|---|
| 2007/0159750 A1* | 7/2007 | Peker | H05B 33/0869 361/93.1 |
| 2008/0243402 A1* | 10/2008 | Rene | H04M 3/10 702/58 |
| 2009/0009088 A1 | 1/2009 | Ito et al. | |
| 2010/0270926 A1 | 10/2010 | Matsui | |
| 2011/0193481 A1 | 8/2011 | Nakamura | |
| 2014/0177109 A1* | 6/2014 | Curtis | H02H 9/08 361/42 |

FOREIGN PATENT DOCUMENTS

| | | |
|---|---|---|
| JP | 2005-267923 A | 9/2005 |
| JP | 2012-122986 A | 6/2012 |
| JP | 2012-153271 A | 8/2012 |
| JP | 2012-171612 A | 9/2012 |

\* cited by examiner

FIG. 12 --PRIOR ART--

POWER SUPPLY DEVICE SUPPLYING LIMITED DC POWER TO LOAD BASED ON GROUND FAULT DETECTION

CROSS REFERENCE TO RELATED APPLICATION

This application is a U.S. national stage application of International Patent Application No. PCT/JP2014/000073 filed on Jan. 10, 2014 and is based on Japanese Patent Application No. 2013-24853 filed on Feb. 12, 2013, the disclosures of which are incorporated herein by reference.

TECHNICAL FIELD

The present disclosure relates to a power supply device suitably used to supply power to, for example, an LED unit.

BACKGROUND

Patent Literature 1 describes a driver circuit (i.e., power supply device) that supplies power to LEDs (Light Emitting Diodes) adopted as vehicle headlights. As shown in FIG. 12, the circuit includes a DC-to-DC converter 40x that supplies power to LEDs 10 by stepping up a battery voltage and a shunt resistor Rs connected to a cathode side (i.e., low-potential side) of the LEDs 10. The DC-to-DC converter 40x detects a drive current (see an arrow Y1 in the drawing) flowing through the LEDs 10 on the basis of an amount of a voltage drop across the shunt resistor Rs and performs a feedback control on an amount of power to be supplied to the LEDs 10 for the detection value to coincide with a target value.

In the event of a ground fault on the cathode side of the LEDs 10 as indicated by an arrow Y2 in the drawing, the detection value due to the shunt resistor Rs no longer takes a value corresponding to the drive current, owing to which the DC-to-DC converter 40x fails to perform the feedback control properly. In other words, when a ground fault occurs, most of the drive current flowing through the LEDs 10 flows to the ground fault side and the detection value due to the shunt resistor Rs becomes lower than a value comparable to the drive current. The DC-to-DC converter 40x thus performs the feedback control so as to increase the detection value to the target value. Accordingly, the drive current is increased further and a concern is raised about damage of the LEDs 10 given by an excessive drive current that flows through the LEDs 10.

In the related art, a ground fault detection circuit 30x stops an operation of the DC-to-DC converter 40x by determining that a ground fault occurs on the cathode side of the LEDs 10 when the detection value fails to rise to or above a predetermined value after an elapse of a certain time since a supply of power to the LEDs 10 is started.

PATENT LITERATURE

Patent Literature 1: JP 2012-153271 A

The technique in the related art, however, cannot detect a ground fault unless a drive current flows through the LEDs 10, and therefore cannot avoid an event that an excessive drive current caused by the ground fault flows through the LEDs 10 for a certain time until the ground fault is detected. Hence, a concern about the damage of the LEDs 10 is not eliminated satisfactorily.

In addition, in a case where a ground fault occurs when ground fault resistance Ra is relatively large, the detection value does not drop sufficiently and it becomes difficult to detect the ground fault itself.

SUMMARY

In view of the foregoing, the present disclosure has an object to provide a power supply device capable of restricting an excessive current from flowing through a load (for example, an LED) as a subject to which power is to be supplied even in the event of a ground fault.

A power supply device according to an aspect of the present disclosure supplies DC power to a load and includes: a shunt resistor connected in series to a low-potential side of the load; a power supply control device for controlling a power supply state to the load according to an amount of a voltage drop across the shunt resistor; a ground fault detection element connected in series to the low-potential side of the load to cause a voltage drop; and a limiting device for limiting a supply of power by the power supply control device by determining that a ground fault occurs in a case where an amount of a voltage drop that occurs when a detection current flowing through the ground fault detection element is less than a predetermined threshold.

According to the configuration as above, an amount of a voltage drop occurring across the ground fault detection element when the detection current is passed through while no drive current flows through the load is anticipated to become small in the presence of a ground fault. Hence, owing to the configuration of the aspect above, a ground fault can be detected without passing an excess drive current through the load and a supply of excess power to the load can be limited in advance.

Even when a ground fault occurs when ground fault resistance is relatively large while no drive current flows through the load, an amount of a voltage drop across the ground fault detection element takes a large value in comparison with an amount of a voltage drop occurring due to the ground fault resistance. Hence, a ground fault can be detected even when the ground fault occurs when the ground fault resistance is large.

BRIEF DESCRIPTION OF DRAWINGS

The above and other objects, features and advantages of the present disclosure will become more apparent from the following detailed description made with reference to the accompanying drawings. In the drawings:

FIG. 12 is a circuit diagram of a power supply device in the related art.

DETAILED DESCRIPTION

Figure 1:
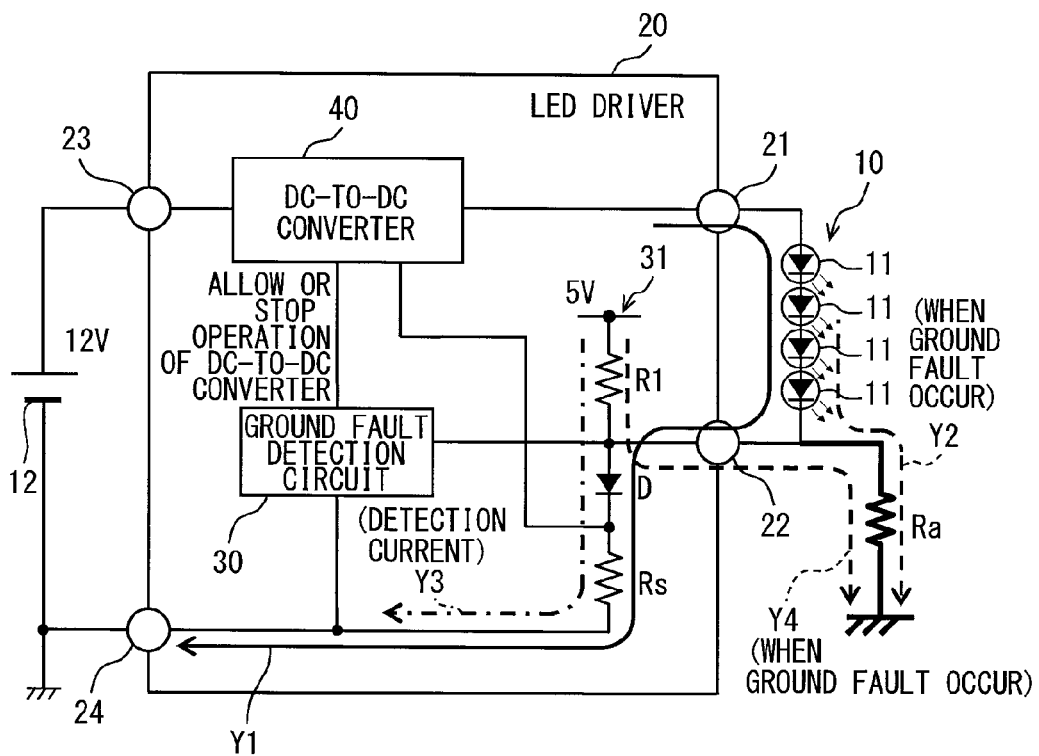
FIG. 1 is a circuit diagram of a power supply device according to a first embodiment of the present disclosure.

Hereinafter, respective embodiments of a power supply device of the present disclosure will be described with reference to the drawings. Among the respective embodiments below, configurations of portions labeled with same reference numerals in the drawings are identical with or equivalent to one another and a reference should be made to one another for the description.

First Embodiment

An LED unit 10 shown in FIG. 1 has multiple light emitting diodes (i.e., LEDs 11) and is applied, for example, to spotlights equipped to a vehicle. An LED driver 20 that supplies DC power to the LEDs 11 (as a load) corresponds to a power supply device of the present embodiment. The LED driver 20 supplies power to the LEDs 11 by stepping-up or stepping-down a voltage across a battery 12 mounted to the vehicle. More specifically, the LED driver 20 steps-up or steps-down a battery voltage of about 12 V to approximately 10 V to 30 V and applies the resulting voltage to the LEDs 11.

Load-side terminals 21 and 22 of the LED driver 20 are connected, respectively, to anode-side and cathode-side terminals of the LEDs 11. Battery-side terminals 23 and 24 of the LED driver 20 are connected, respectively, to a positive terminal and a negative terminal of the battery 12. The battery-side terminal 24 on the minus terminal side is grounded at 0 V.

The LED driver 20 includes a DC-to-DC converter 40 having a step-up/down circuit that steps-up or steps-down a battery voltage, and a shunt resistor Rs connected in series to a low-potential side of the LED unit 10. An amount of a voltage drop across the shunt resistor Rs becomes larger as a drive current flowing through the LED unit 10 becomes larger. In other words, an amount of a voltage drop is a value corresponding to the drive current. Hereinafter, an amount of a voltage drop or a drop amount in terms of the drive current will be referred to as a "shunt resistor detection value."

The DC-to-DC converter 40 controls an amount of power to be supplied to the LED unit 10 according to the shunt resistor detection value. More specifically, the DC-to-DC converter 40 has a control circuit that controls an output voltage for the shunt resistor detection value to coincide with a target value. The DC-to-DC converter 40 therefore functions as a "power supply control device." Hence, the DC-to-DC converter 40 performs a feedback control to maintain the drive current at a constant target value even when a resistance value of the LEDs 11 varies or the battery voltage varies due to an environmental temperature change.

For example, when the DC-to-DC converter 40 controls the magnitude of an output current by controlling a duty of an ON time or an OFF time by switching the output current to be ON or OFF in predetermined cycles, the DC-to-DC converter 40 performs the feedback control on the duty according to the shunt resistor detection value.

The LED driver 20 further includes a ground fault detection diode D (as a ground fault detection element), a ground fault detection circuit 30, and a detection current output circuit 31, all of which will be described in the following. The diode D is connected in series to the low-potential side of the LED unit 10. More specifically, the diode D is connected in series between the shunt resistor Rs and the LED unit 10. A cathode terminal of the diode D is connected on the side of the shunt resistor Rs and an anode terminal of the diode D is connected to the cathode side of the LED unit 10.

The detection current output circuit 31 is a circuit that passes a detection current by applying a detection voltage to the diode D. For example, the detection current output circuit 31 passes the detection voltage from a constant voltage source to the diode D as the detection current via a resistor R1. A value of the constant voltage is set to a value lower than a value of the battery voltage. For example, the detection current output circuit 31 uses a drive voltage (5 V) of a microcomputer as the detection voltage.

The ground fault detection circuit 30 detects a ground fault by detecting an amount of a voltage drop across the diode D and the shunt resistor Rs and determining whether a ground fault occurs on the cathode side of the LED unit 10 on the basis of the detection value. More specifically, the ground fault detection circuit 30 determines the occurrence of a ground fault when the detected amount of a voltage drop is less than a preliminarily set threshold. Upon detection of the ground fault, the ground fault detection circuit 30 outputs a stop instruction signal to the DC-to-DC converter 40 to stop an operation of the DC-to-DC converter 40. When no ground fault is detected, the ground fault detection circuit 30 outputs an enabling signal to the DC-to-DC converter 40 to allow an output of the drive current.

The ground fault detection circuit 30 makes a ground fault determination before power is supplied to the LED unit 10. When an amount of a voltage drop detected by the ground fault detection circuit 30 is as large as or larger than a first threshold, the ground fault detection circuit 30 outputs the enabling signal to allow the DC-to-DC converter 40 to light the LED unit 10 by outputting the drive current. On the other hand, when the detected amount of a voltage drop is less than the first threshold, the ground fault detection circuit 30 outputs the stop instruction signal to limit an operation so as not to light the LED unit 10.

The ground fault detection circuit 30 makes a ground fault determination while the LED unit 10 is in operation on the assumption that a ground fault occurs while the LED unit 10 is operating normally with a supply of power. In other words, even when an amount of a voltage drop detected by the ground fault detection circuit 30 is less than a second threshold, the ground fault detection circuit 30 outputs the stop instruction signal to stop or limit an application of the current to the LED unit 10 by stopping or reducing the drive current.

Figure 11A:
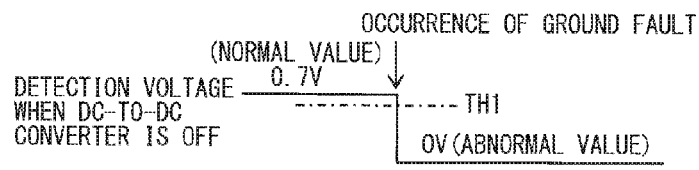
FIG. 11A is a view describing a first threshold used for a ground fault determination in the sixth embodiment.
Figure 11B:
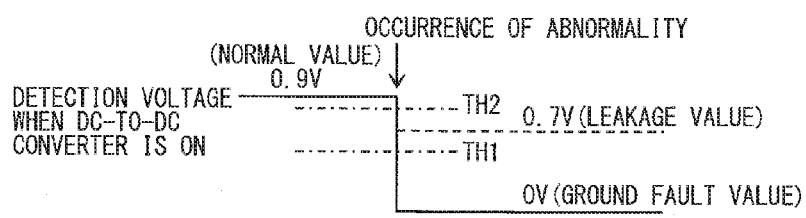
FIG. 11B is a view describing a second threshold used for the ground fault determination in the sixth embodiment.
Figure 11B:
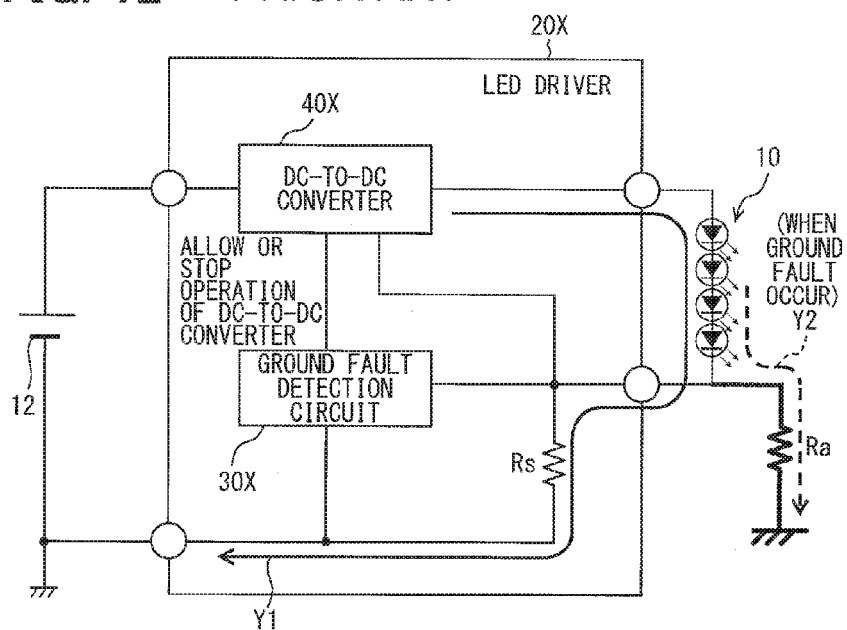

As is shown in FIG. 11B by way of example, a second threshold TH2 is set to a value higher than a first threshold TH1. The detection current output circuit 31 may constantly output the detection current, or alternatively the detection current output circuit 31 may stop an output of the detection current while power is supplied to the LED unit 10 or stop an output of the detection current when a ground fault determination is not necessary because a supply of power to the LED unit 10 is not required.

A current outputted from the DC-to-DC converter 40 sequentially flows through the LED unit 10, the diode D, and the shunt resistor Rs and flows to the battery 12 through the battery-side terminal 24 (see an arrow Y1). It should be noted, however, that most of the drive current flowing through the LED unit 10 flows to the ground fault side (see an arrow Y2) when a ground fault occurs on the cathode side of the LED unit 10. Consequently, the shunt resistor detection value becomes lower than a value comparable to the drive current. The shunt resistor detection value becomes closer to a normal value in the absence of a ground fault as ground fault resistance Ra becomes larger.

The detection current outputted from the detection current output circuit 31 sequentially flows through the diode D and the shunt resistor Rs and flows to the battery 12 through the battery-side terminal 24 (see an arrow Y3). It should be noted, however, that the detection current flows to the ground fault side (see an arrow Y4) when a ground fault occurs as described above.

Figure 2:
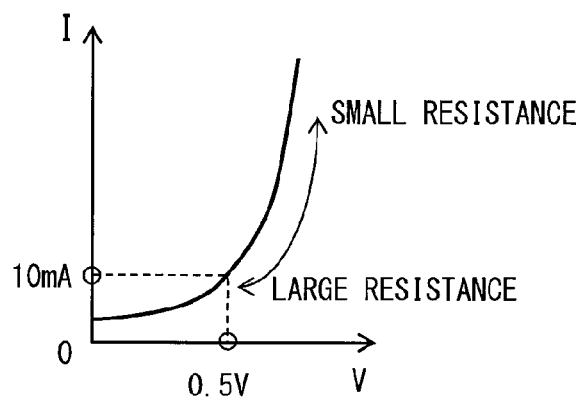
FIG. 2 is a view showing current-to-voltage characteristics of a diode of FIG. 1.

As is shown in FIG. 2, current-to-voltage characteristics of the diode D are non-linear. That is to say, electrical resistance across the diode D becomes small when a current flowing through the diode D is large. Hence, while a large current (about 1 A) is flowing through the diode D because a power is supplied to the LED unit 10, the drive current can be passed at low heat generation and a low loss.

On the other hand, the electrical resistance across the diode D becomes larger in an exponential manner as a current flowing through the diode D becomes smaller. Hence, even when a minute detection current (about 10 mA) flows through the diode D by stopping a supply of power to the LED unit 10, a large voltage drop occurs and hence a ground fault can be detected. Accordingly, even when the ground fault resistance Ra is large, an amount of the voltage drop varies considerably. Detection accuracy of a ground fault by the ground fault detection circuit 30 can be thus enhanced.

More strictly, even when the diode D is omitted, an amount of a voltage drop across the shunt resistor Rs by the detection current decreases at the occurrence of a ground fault. Hence, a ground fault can be detected by detecting such a decrease. However, because the shunt resistor Rs is required to pass the drive current at low heat generation and a low loss while the LED unit 10 is lit, the resistance value cannot be increased satisfactorily. The detection current cannot be increased for the same reason. Hence, an amount of a voltage drop across the shunt resistor Rs by the detection current is extremely small and therefore it is difficult to detect a ground fault on the basis of the shunt resistor Rs alone.

On the contrary, the present embodiment is characterized in that the ground fault detection element is the diode (D) whose cathode side is connected to the low-potential side. In other words, apart from the shunt resistor Rs, the diode D across which a certain voltage drop occurs is connected in series to the low-potential side of the LED unit 10. The diode D typically has non-linear characteristics shown in FIG. 2. Hence, a large voltage drop occurs even when a minute detection current is applied to the diode D while the LED unit 10 is not in operation. Detection accuracy of a ground fault can be thus enhanced. Even when the drive current, which is a large current in comparison with the detection current, flows through the diode D while the LED unit 10 is lit, a voltage drop across the diode D can be small in comparison with a case where a ground fault detection element having linear characteristics is adopted. Hence, an amount of a power loss occurring across the diode D while the LED 10 is lit can be reduced.

The present embodiment is further characterized by including the detection current output circuit 31 that outputs the detection current to the diode D (as a ground fault detection element). According to the characteristics, the detection current output circuit 31 is included as a power outputting device apart from the DC-to-DC converter 40. The detection current can be thus passed through the diode D without having to pass the drive current through the LED unit 10. An event that the drive current flows through the LED unit 10 when a ground fault occurs can be thus avoided in a reliable manner.

The present embodiment is further characterized in that the diode D (as a ground fault detection element) is connected in series to a high-potential side of the shunt resistor Rs.

Contrary to the present embodiment, in a case where the diode D is connected in series to the low-potential side of the shunt resistor Rs, when the DC-to-DC converter 40 performs the feedback control using the shunt resistor detection value, accuracy of the control to adjust the drive current to be the target value becomes poor for the reason as follows. That is, when the diode D is connected to the low-potential side of the shunt resistor Rs, potential on the low-potential side of the shunt resistor Rs does not coincide with the GND potential of the LED driver 20 and becomes higher due to an offset comparable to a voltage drop across the diode D. It thus becomes necessary to calculate the drive current by taking a quantity of the offset into consideration, which makes calculation accuracy poor or the detection circuit more complex.

In contrast, according to the characteristics of the present embodiment, potential on the low-potential side of the shunt resistor Rs coincides with the GND potential of the LED driver 20. Hence, calculation accuracy of the drive current can be enhanced using a simple circuit, which can in turn enhance accuracy of the feedback control.

The present embodiment is further characterized in that when it becomes necessary to put the LED unit 10 (as a load) into operation, the ground fault detection circuit 30 (as a limiting device) detects an amount of a voltage drop before the DC-to-DC converter 40 (as a power supply control device) supplies power to the LED unit 10 and allows the DC-to-DC converter 40 to supply power when the detected amount of a voltage drop is as large as or larger than the threshold.

When configured as above, a supply of power to the LED unit 10 is allowed after the absence of a ground fault is confirmed. Consequently, an event that an excess drive current caused by a ground fault flows through the LED unit 10 even for a short time can be avoided in a reliable manner.

Second Embodiment

Figure 3:
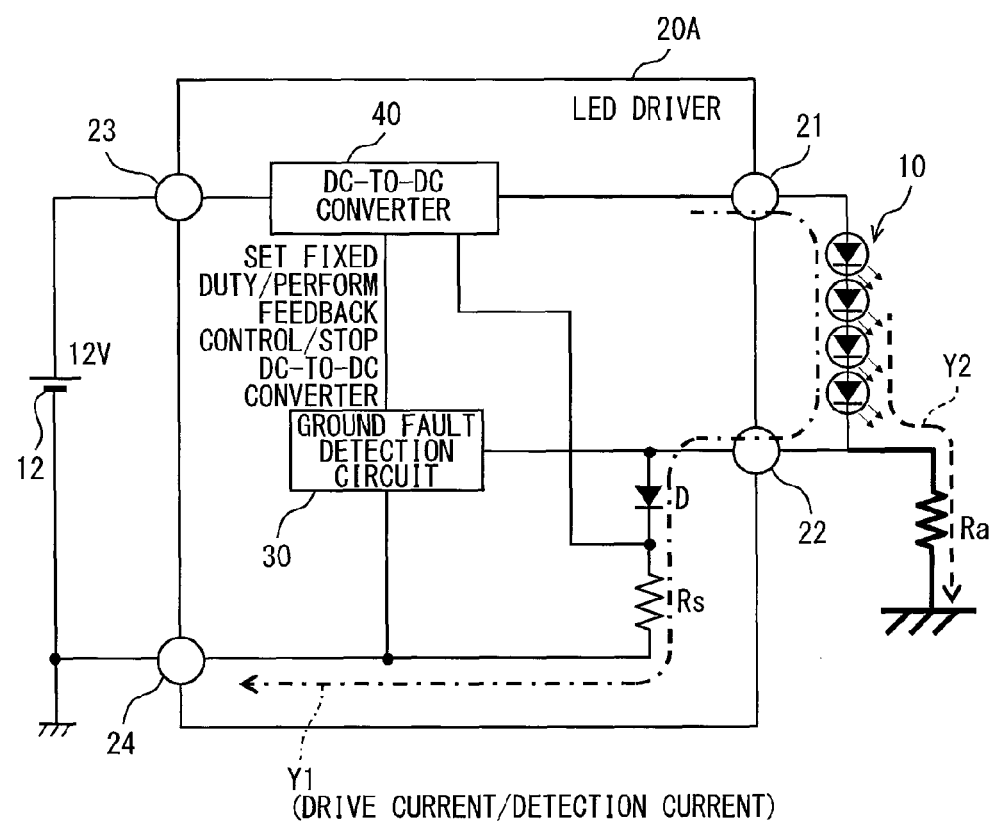
FIG. 3 is a circuit diagram of a power supply device according to a second embodiment of the present disclosure.

The LED driver 20 of the first embodiment above includes the detection current output circuit 31 that outputs the detection current to the diode D. On the contrary, an LED driver 20A of the present embodiment shown in FIG. 3 is configured in such a manner that a DC-to-DC converter 40 outputs a detection current to a diode D, and omits the detection current output circuit 31. In other words, the present embodiment is characterized in that the DC-to-DC converter 40 (as a power supply control device) outputs a detection current to the diode D (as a ground fault detection element) before supplying power to an LED unit 10 (as a load). The detection current herein is a minute drive current by an operation at a preliminarily set fixed duty by the DC-to-DC converter 40 instead of a drive current by a feedback control according to a shunt resistor detection value.

Figure 4:
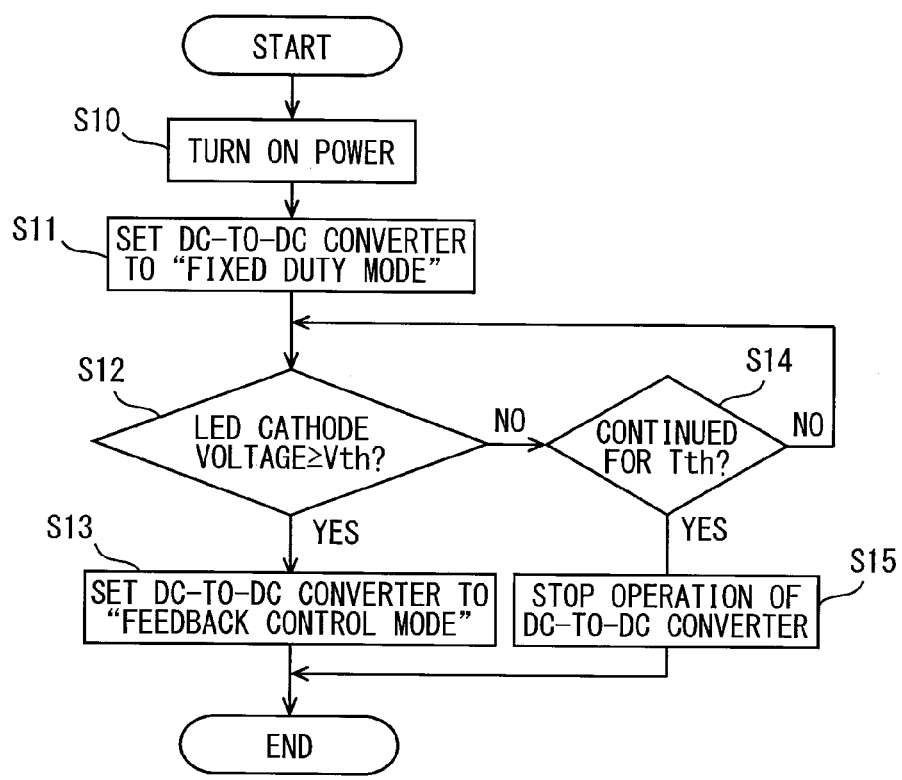
FIG. 4 is a flowchart depicting a control in the second embodiment.

FIG. 4 is a flowchart depicting a control procedure of the LED driver 20A of the present embodiment. The control is performed by a control device equipped to the DC-to-DC converter 40 when a vehicle ignition switch is switched ON or a lighting switch of the LED unit 10 is switched ON.

Firstly, power is turned on to the LED driver 20A at Step S10 of FIG. 4. At subsequent Step S11, the DC-to-DC converter 40 is set to a fixed duty mode in which a fixed duty ratio is outputted so that a minute amount of the drive current described above is outputted. In the fixed duty mode, the feedback control according to the shunt resistor detection value is inhibited.

At subsequent Step S12, a determination is made as to whether a cathode voltage of LEDs 11 (namely, a voltage on a low-potential side of the LED unit 10) is as high as or higher than a predetermined voltage Vth. The LED cathode voltage corresponds to an amount of a voltage drop across the diode D and a shunt resistor Rs.

When it is determined as: LED cathode voltage ≥Vth (i.e., YES at S12), it is assumed that no ground fault occurs. The DC-to-DC converter 40 is thus switched at subsequent Step S13 to a feedback control mode in which the feedback control according to the shunt resistor detection value is performed. On the other hand, when it is determined as: LED cathode voltage <Vth (i.e, NO at S12), it is assumed that a ground fault occurs. On the condition that the state, LED cathode voltage <Vth, has continued for a predetermined time Tth (i.e., YES at S14), an operation of the DC-to-DC converter 40 is stopped (at S15).

In the present embodiment, the detection current flows through the LED unit 10 when a determination is not made as to whether a ground fault occurs or not. Hence, a current may possibly flow through the LED unit 10 when a ground fault occurs. However, the detection current is passed while the feedback control is inhibited and the detection current is set to a minute amount. Accordingly, even when the detection current flows through the LED unit 10 in a ground fault state, the LED unit 10 is not damaged by the detection current.

The control may be performed in the same manner in the absence of the diode D. However, it becomes necessary to detect a ground fault on the basis of an amount of a voltage drop across the shunt resistor Rs alone. Accordingly, the fixed duty of the DC-to-DC converter 40 has to be set to a value large enough to pass a reasonably large detection current. However, an operation at such a fixed duty leaves a possibility that an excess current is applied and gives damage to the LEDs 11 when a condition of the battery 12 or the load changes.

As has been described, according to the present embodiment, a ground fault can be detected while avoiding an event that an excess drive current flows through the LED unit 10 by the LED driver 20A which is configured simpler by omitting the detection current output circuit 31 shown in FIG. 1.

Third Embodiment

Figure 5:
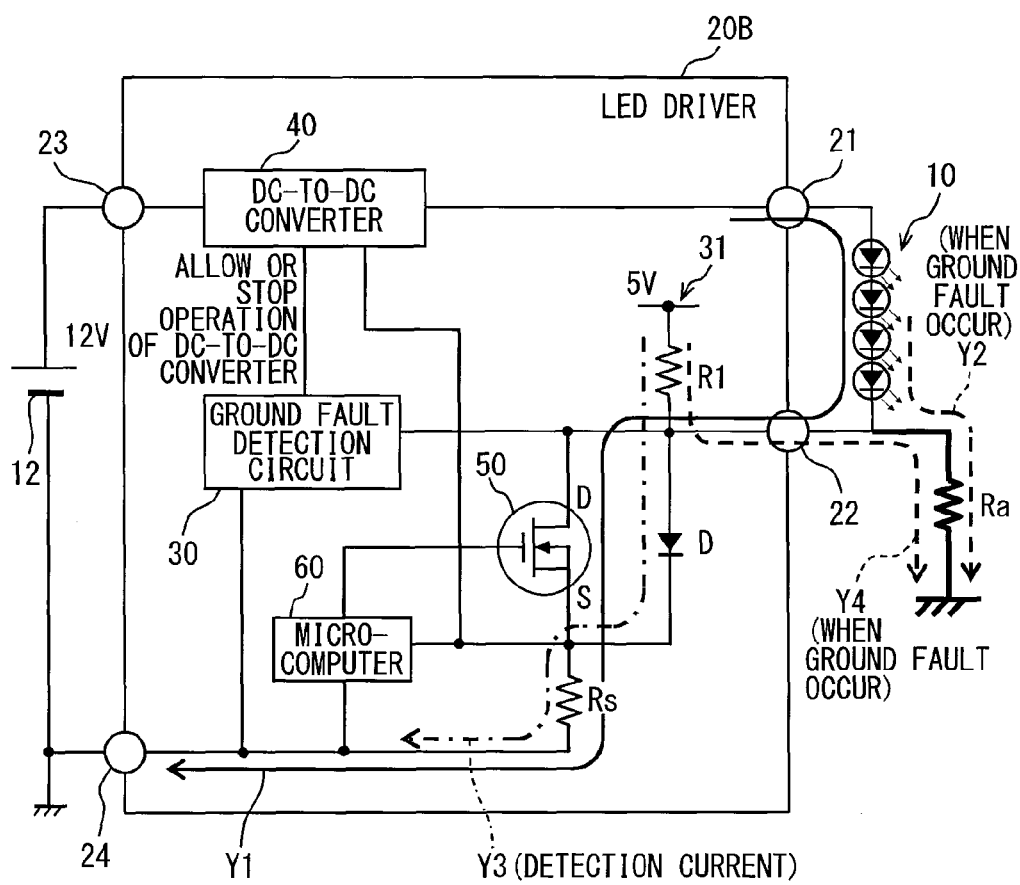
FIG. 5 is a circuit diagram of a power supply device according to a third embodiment of the present disclosure.

As is shown in FIG. 5, an LED driver 20B of the present embodiment includes a switching element 50 connected in parallel to a diode D and a control device 60 for controlling the switching element 50 to be ON while power is supplied to an LED unit 10 and controlling the switching element 50 to be OFF when a supply of power to the LED unit 10 is stopped.

The switching element can be a MOSFET (Metal-Oxide-Semiconductor Field Effect Transistor), a bipolar transistor, an IGBT (Insulated Gate Bipolar Transistor), and so on. In the example of FIG. 5, an n-channel MOSFET 50 is used as the switching element and a microcomputer 60 is used as the control device. The microcomputer 60 controls the MOSFET 50 to turn ON and OFF by controlling a gate terminal voltage of the MOSFET 50.

Because the MOSFET 50 is OFF when a supply of power to the LED unit 10 is stopped, a detection current flows through the diode D as indicated by an alternate and short dash line Y3 in the drawing. Accordingly, advantageous effects same as those of the first embodiment above shown in FIG. 1 can be achieved. In other words, because a large voltage drop occurs across the diode D for a minute detection current, a decrease in the amount of a voltage drop when a ground fault occurs as indicated by a dotted line Y4 can be detected. Detection accuracy of a ground fault can be thus enhanced.

On the other hand, because the MOSFET 50 is ON while power is supplied to the LED unit 10, a large current (as a drive current) from the LED unit 10 flows through the MOSFET 50 as indicated by a solid line Y1 and no longer flows through the diode D. Because a power loss across the MOSFET 50 is extremely small in comparison with the diode D, a power loss occurring while the LED unit 10 is driven can be reduced.

Fourth Embodiment

Figure 6:
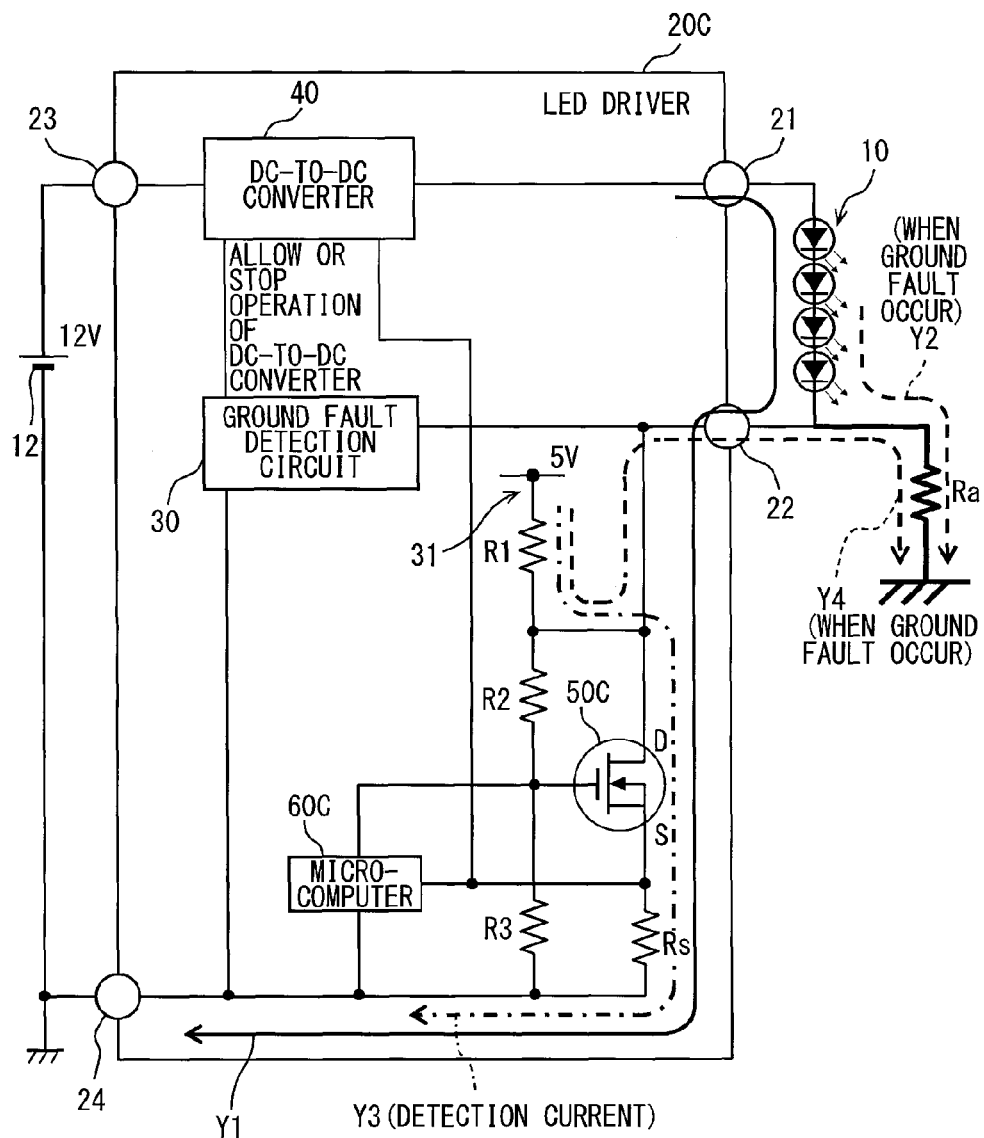
FIG. 6 is a circuit diagram of a power supply device according to a fourth embodiment of the present disclosure.

As is shown in FIG. 6, an LED driver 20C of the present embodiment is a modification of the LED driver 20B of FIG. 5. The modification can omit the diode D by providing dividing resistors R2 and R3, respectively, between a drain and a gate and between a gate and a source of the MOSFET 50 of the LED driver 20B.

In other words, in the LED driver 20C of the present embodiment, a ground fault detection element is a MOSFET 50C. The LED driver 20C includes a control device 60C for controlling the MOSFET 50C to be ON while a power is supplied to an LED unit 10 and controlling the MOSFET 50C to operate for a gate to be in a Hi (High)-impedance state when a supply of power to the LED unit 10 is stopped.

In the example of FIG. 6, the MOSFET 50C is adopted as the switching element. However, a bipolar transistor or an IGBT may be adopted as well.

Also, a microcomputer 60 is used as the a control device 60C. The microcomputer 60 controls an operation of the MOSFET 50C by controlling a gate voltage of the MOSFET 50C. More specifically, the microcomputer 60 controls an operation of the MOSFET 50C to switch to one of a Hi-impedance ON state, a normal ON state, and an OFF state, all of which will be described in the following.

The "OFF state" is a state in which a drain-source current is blocked by controlling a gate-source voltage to be 0 V. The "normal ON state" is a state in which a current is allowed to pass between the drain and source at low resistance by controlling a gate-source voltage to be a voltage (for example, 5 V) as high as or higher than a gate threshold voltage. The "Hi-impedance ON state" is a state in which a current is allowed to pass between the drain and the source while letting a voltage drop comparable to the gate threshold voltage occur by controlling the gate to be in a Hi-impedance state.

Figure 7:
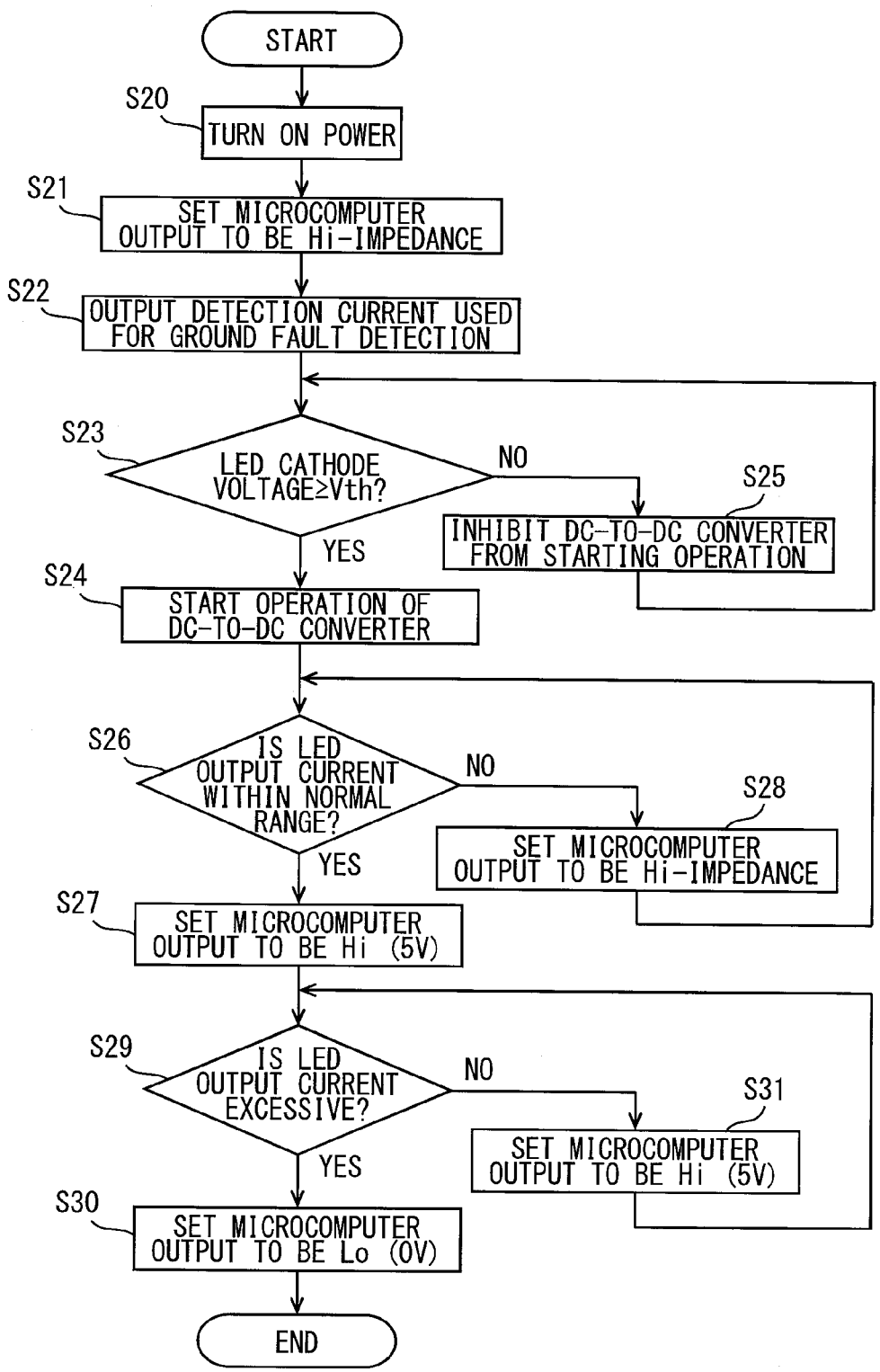
FIG. 7 is a flowchart depicting a control in the fourth embodiment.

FIG. 7 is a flowchart depicting a control procedure of the LED driver 20C in the present embodiment. Firstly, power is turned on to the LED driver 20C at Step S20 of FIG. 7. At subsequent Step S21, the gate of the MOSFET 50C is controlled to be at Hi-impedance. In other words, the MOSFET 50C is controlled to operate in the Hi-impedance ON state. At subsequent Step S22, a detection current is outputted from a detection current output circuit 31. The detection current may be constantly outputted while the LED unit 10 is in operation or an output of the detection current may be stopped while the LED unit 10 is in operation.

At subsequent Step S23, a determination is made as to whether a cathode voltage of LEDs 11 (namely, a voltage on a low-potential side of the LED unit 10) is as high as or higher than a predetermined voltage Vth. The LED cathode voltage corresponds to an amount of a voltage drop across the MOSFET 50C and a shunt resistor Rs.

When it is determined as: LED cathode voltage Vth (i.e., YES at S23), it is assumed that no ground fault occurs. A feedback control according to a shunt resistor detection value is thus performed at subsequent Step S24 by starting an operation of a DC-to-DC converter 40. On the other hand, when it is determined as: LED cathode voltage <Vth (i.e., NO at S23), it is assumed that a ground fault occurs. An operation of the DC-to-DC converter 40 is thus inhibited (at S25).

When the DC-to-DC converter 40 starts an operation at Step S24, a determination is made at subsequent Step S26 as to whether an output current of the LEDs 11 is within a normal range according to the shunt resistance detection value. When it is determined that the output current is within the normal range (i.e., YES at S26), a control signal to be outputted from the microcomputer 60C is raised to a voltage (5 V) as high as or higher than the gate threshold at subsequent Step S27. In other words, the MOSFET 50C is controlled to operate in the normal ON state. On the other hand, when it is determined that the output current is out of the normal range (i.e., NO at S26), the MOSFET 50C is controlled to stay in the Hi-impedance ON state at subsequent Step S28.

When the MOSFET 50C is switched to the normal ON state at Step S27, a determination is made at Step S29 as to whether an output current of the LEDs 11 is excessive according to the shunt resistor detection value. When it is determined that the output current is excessive (i.e., YES at S29), the control signal to be outputted from the microcomputer 60C is changed to Lo (0 V) so as to switch the MOSFET 50C to the OFF state. On the other hand, when it is determined that the output current is not excessive (i.e., NO at S29), the MOSFET 50C is controlled to stay in the normal ON state at subsequent S28.

According to the present embodiment, the MOSFET 50C is maintained in the Hi-impedance ON state when a supply of power to the LED unit 10 is stopped. Hence, the detection current flows between the drain and source of the MOSFET 50C as indicated by an alternate long and short dash line Y3 in the drawing. Consequently, advantageous effects same as those of the first embodiment above shown in FIG. 1 can be achieved. In other words, a large voltage drop occurs across the MOSFET 50C for a minute detection current. Hence, a decrease in amount of a voltage drop when a ground fault occurs as is indicated by a dotted line Y4 can be detected. Detection accuracy of a ground fault can be thus enhanced. In other words, a ground fault can be detected while avoiding an event that an excess drive current flows through the LED unit 10 by the LED driver 20C which is configured simpler by omitting the diode D shown in FIG. 5.

On the other hand, the MOSFET 50C is normally ON while power is supplied to the LED unit 10. Hence, a power loss occurring across the MOSFET 50C when a large current (as a drive current) from the LED unit 10 flows through the MOSFET 50C as indicated by a solid line Y1 can be reduced.

Further, the present embodiment is characterized in that the microcomputer 60C (as a control device) turns OFF the MOSFET 50C (as a field effect transistor) when it is assumed that an excess drive current is outputted.

In the present embodiment, too, an event that an excess drive current flows through the LED unit 10 is avoided in the same manner as in the first through third embodiments by stopping the DC-to-DC converter 40 upon detection of a ground fault while the LED unit 10 is in operation. In addition to the fail-safe control as above, the MOSFET 50C is turned OFF (at S30) upon detection of an excess drive current (i.e., YES at S29) in the present embodiment. Hence, the LED driver 20C is doubly fail-safe. Consequently, even when the DC-to-DC converter 40 fails, an event that an excess drive current flows through the LED unit 10 can be avoided by turning OFF the MOSFET 50C.

Fifth Embodiment

Figure 8:
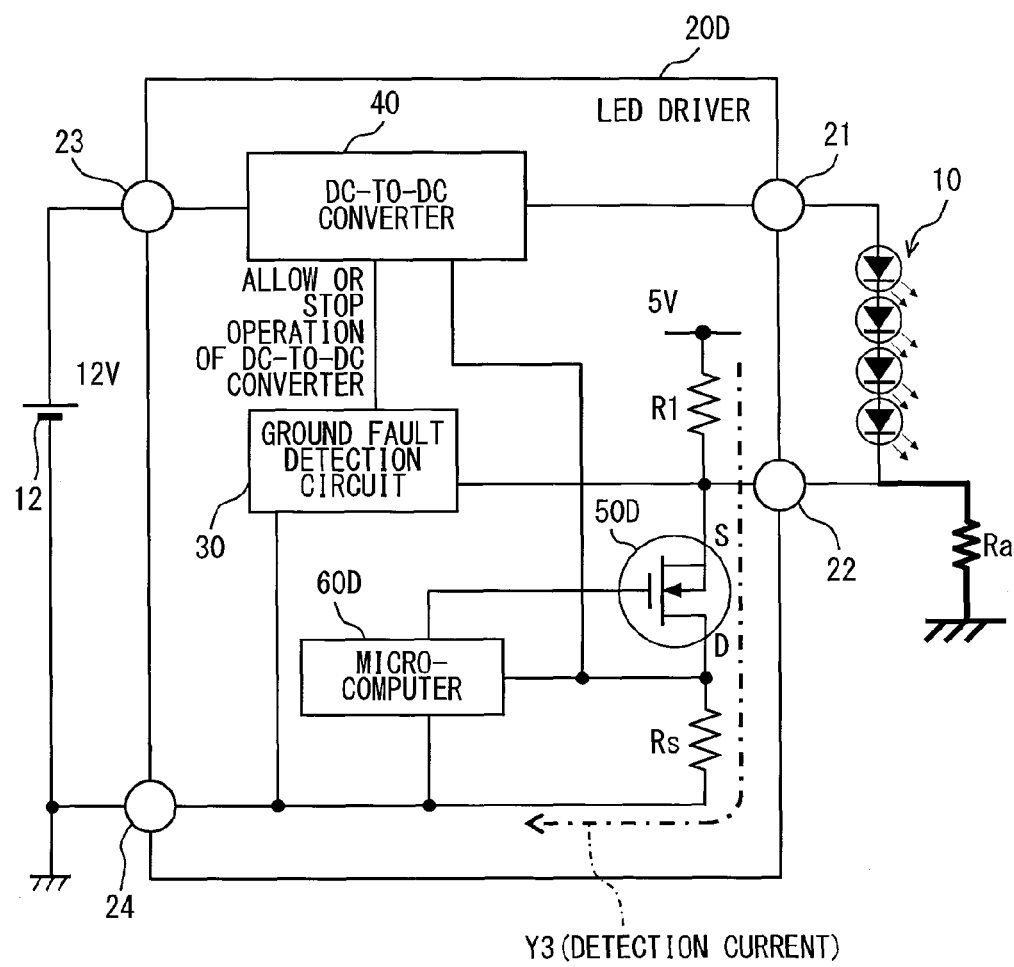
FIG. 8 is a circuit diagram of a power supply device according to a fifth embodiment of the present disclosure.

As is shown in FIG. 8, an LED driver 20D of the present embodiment is a modification of the LED driver 20 of FIG. 1, and the diode D (as a ground fault detection element) of the LED driver 20 is replaced by an N-channel MOSFET 50D.

In other words, in the LED driver 20D of the present embodiment, a ground fault detection element is the MOSFET 50D and the MOSFET 50D is connected in such a manner that a source side of the MOSFET 50D is positioned on the side of an LED unit 10 (as a load). In other words, the MOSFETs 50 and 50C of FIGS. 5 and 6 and the MOSFET 50D of this embodiment are connected in opposite directions, and the LED driver 20D includes a microcomputer 60D (as a control device) that controls the MOSFET 50D to be ON while power is supplied to the LED unit 10 and controls the field effect transistor 50D to be OFF when a supply of power to the LED unit 10 is stopped.

The microcomputer 60D controls an operation of the MOSFET 50D by controlling a gate terminal voltage of the MOSFET 50D. More specifically, the microcomputer 60D controls an operation of the MOSFET 50 to switch to either the normal ON state or the OFF state described above.

Figure 9:
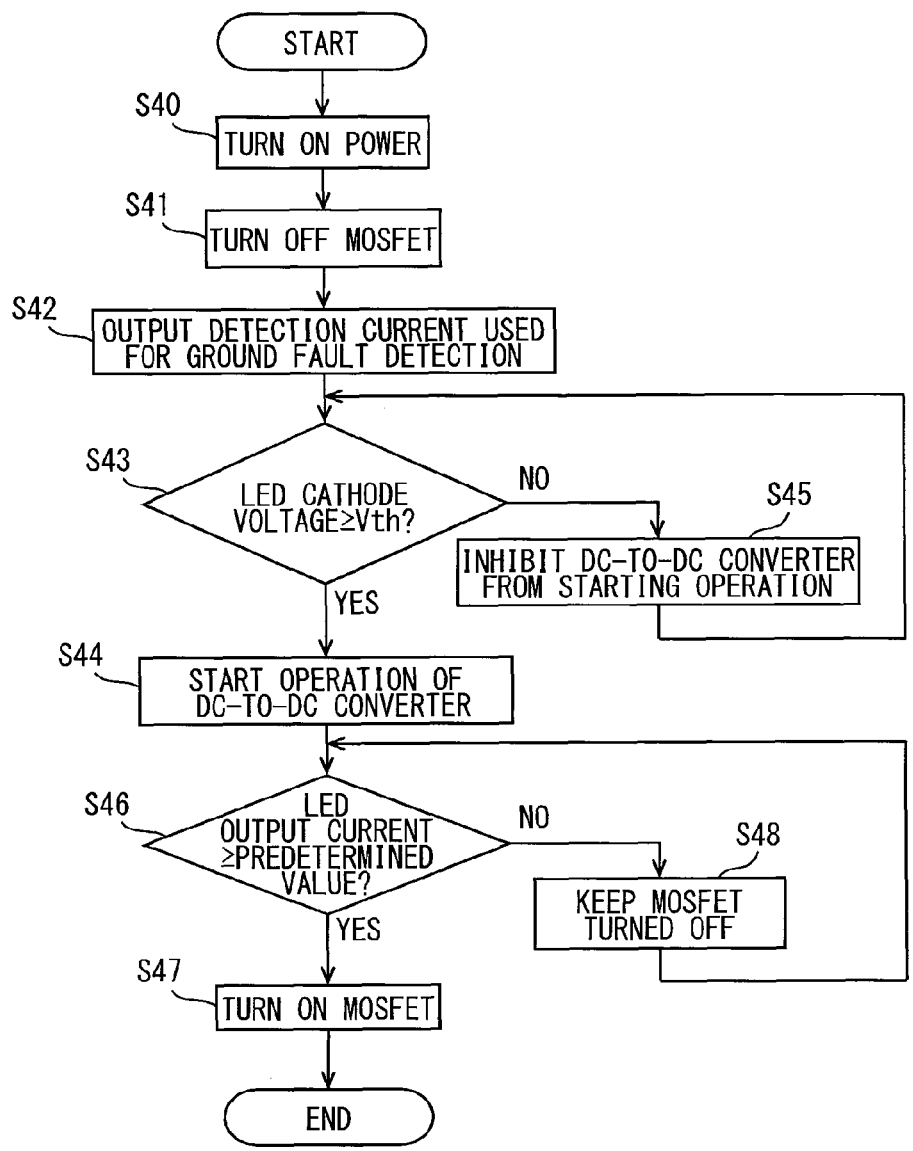
FIG. 9 is a flowchart depicting a control in the fifth embodiment.

FIG. 9 is a flowchart depicting a control procedure of the LED driver 20D of the present embodiment. Firstly, power is turned on to the LED driver 20D at step S40 of FIG. 9. At subsequent step S41, the MOSFET 50D is switched to the OFF state. In the OFF state, a parasitic diode of the MOSFET 50D functions in the same manner as the diode D of FIG. 1.

At subsequent Step S42, a detection current is outputted from a detection current output circuit 31. The detection current may be constantly outputted while the LED unit 10 is in operation or an output of the detection current may be stopped while the LED unit 10 is in operation.

At subsequent Step S43, a determination is made as to whether a cathode voltage of LEDs 11 (namely, a voltage on a low potential side of the LED unit 10) is as high as or higher than a predetermined voltage Vth. The LED cathode voltage corresponds to an amount of a voltage drop across the MOSFET 50D and a shunt resistor Rs.

When it is determined as: LED cathode voltage ≥Vth (i.e., YES at S43), it is assumed that no ground fault occurs. A feedback control according to a shunt resistor detection value is thus performed at subsequent Step S44 by staring an operation of a DC-to-DC converter 40. On the other hand, when it is determined as: LED cathode voltage <Vth (i.e., NO at S43), it is assumed that a ground fault occurs. An operation of the DC-to-DC converter 40 is thus inhibited (at S45).

When the DC-to-DC converter 40 starts an operation at Step S44, a determination is made at subsequent Step S46 as to whether an output current of the LEDs 11 is as high as or higher than a predetermined value Ith on the basis of the shunt resistor detection current. When it is determined that the output current is as high as or higher than the predetermined value (i.e., YES at S46), it is assumed that the drive current is outputted normally. The MOSFET 50D is thus controlled to operate in the normal ON state at subsequent Step S47. On the other hand, when it is determined that the output current is less than the predetermined value (i.e., NO at S46), the MOSFET 50D is controlled to stay in the OFF state at subsequent Step S48.

As with the diode D of FIG. 1, the parasitic diode of the MOSFET 50D has non-linear characteristics between the detection current and an amount of a voltage drop. Because the MOSFET 50D is controlled to be OFF when a supply of power to the LED unit 10 is stopped, a large voltage drop occurs across the parasitic diode for a minute detection current. Hence, detection accuracy of a ground fault can be enhanced. On the other hand, because the MOSFET 50D is controlled to be ON while power is supplied to the LED unit 10, electric resistance when a large current (as a drive current) from the LED unit 10 flows through the MOSFET 50D can be made extremely small. Hence, the occurrence of a large power loss occurring across the parasitic diode while the LED unit 10 is driven can be avoided.

Sixth Embodiment

Figure 10:
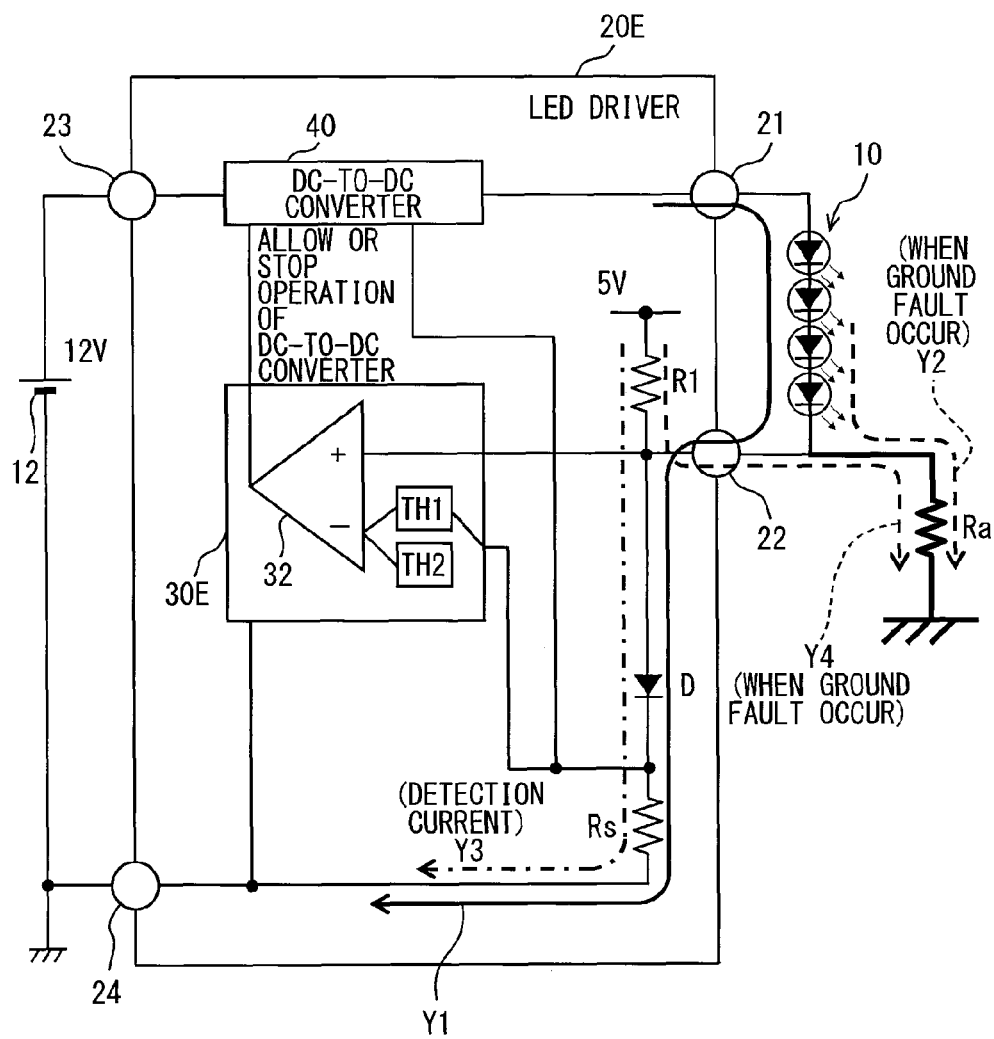
FIG. 10 is a circuit diagram of a power supply device according to a sixth embodiment of the present disclosure.

As is shown in FIG. 10, an LED driver 20E of the present embodiment is a modification of the LED driver 20 of FIG. 1. A threshold used for a ground fault determination by a ground fault detection circuit 30E is changed according to an operation state of an LED unit 10.

In other words, the present embodiment is characterized in that the LED driver 20E includes the ground fault detection circuit 30E (as a changing device) that changes the threshold to a larger value while power is supplied to the LED unit 10 (as a load) than the threshold used when a supply of power is stopped.

The ground fault detection circuit 30E determines whether a cathode voltage of LEDs 11 (namely, a voltage on a low-potential side of the LED unit 10) is as large as or larger than thresholds TH1 and TH2. The LED cathode voltage corresponds to an amount of a voltage drop across a diode D and a shunt resistor Rs.

FIG. 11A shows the first threshold TH1 used when a supply of power to the LED unit 10 is stopped by stopping an operation of a DC-to-DC converter 40. The first threshold TH1 is set to a value lower than a logical value (for example, 0.7 V) of an amount of a voltage drop occurring across the diode D in a normal state in the absence of a ground fault. When a ground fault occurs, a ground fault state is determined because the amount of a voltage drop drops below the threshold TH1.

FIG. 11B shows the second threshold TH2 used while power is supplied to the LED unit 10 by starting an operation of the DC-to-DC converter 40. The second threshold TH2 is set to a value lower than a logical value (for example, 0.9 V) of an amount of a voltage drop occurring across the diode D and the shunt resistor Rs in a normal state in the absence of a ground fault and higher than the first threshold used when a supply of power is stopped.

A comparator 32 equipped to the ground fault detection circuit 30E compares the cathode voltage (as an amount of a voltage drop) of the LEDs 11 with the threshold TH1 or TH2 to determine which one is the larger or the smaller. When the comparison result is, an amount of a voltage drop <TH1 or TH2, it is assumed that a ground fault occurs. The ground fault detection circuit 30E thus outputs an operation stop instruction signal to the DC-to-DC converter 40. On the other hand, when the comparison result is, an amount of a voltage drop ≥TH1 or TH2, it is assumed that no ground fault occurs and the ground fault detection circuit 30E outputs an operation enabling signal to the DC-to-DC converter 40.

The ground fault detection circuit 30E obtains a shunt resistor detection value and switches the threshold TH1 and the threshold TH2 used in the comparator 32 from the former to the latter or vice versa according to the obtained value. In other words, when the shunt resistor voltage value is 0 V, because a supply of power to the LED unit 10 is stopped, the ground fault detection circuit 30E makes a switch to use the first threshold TH1. On the other hand, when the shunt resistor voltage value is a voltage (about 0.2 V) on which power is supplied to the LED unit 10, the ground fault detection circuit 30E makes a switch to use the second threshold TH2.

In a case where a ground fault occurs when ground fault resistance Ra is large (i.e., leakage state) while power is supplied to the LED unit 10, an amount of a voltage drop may become larger than the first threshold TH1 in some cases. Hence, when a ground fault is determined using the first threshold TH1 while power is supplied to the LED unit 10, a concern is raised about a risk of failing to detect the leakage state.

In order to eliminate such a concern, attention is paid to the fact that a normal value of an amount of a voltage drop is larger while power is supplied than when a supply of power is stopped, and the threshold is changed to a large value while power is supplied in comparison with the threshold used when a supply of power is stopped in the present embodiment. Hence, even when a ground fault occurs in the leakage state as above, the ground fault can be detected at good accuracy.

Modifications

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

In the first embodiment above, the ground fault detection circuit 30 detects whether a ground fault occurs or not according to an amount of a voltage drop across the shunt resistor Rs and the diode D. However, the ground fault detection circuit 30 may be configured so as to detect whether a ground fault occurs or not according to an amount of a voltage drop across the diode D alone.

When a supply of power by the DC-to-DC converter 40 is limited upon detection of the occurrence of a ground fault, a supply of power is limited by stopping an operation of the DC-to-DC converter 40 in the respective embodiments above. Alternatively, it may be configured in such a manner that the LED unit 10 is lit at lower luminance than normal luminance by allowing a predetermined amount of the drive current to flow while inhibiting the feedback control according to the shunt resistor detection value.

The respective embodiments have described cases where a subject (as a load) to which power is to be supplied by the LED driver (as a power supply control device) is the LED unit 10 including the LEDs 11 by way of example. It should be appreciated, however, that the subject may be a load other than the LED unit 10. Further, the load is not limited to a load equipped to the vehicle.

In the first embodiment above, the diode D (as a ground fault detection element) is connected in series to the high-potential side of the shunt resistor Rs. However, the diode D may be connected in series to the low-potential side of the shunt resistor Rs instead.

The invention claimed is:

1. A power supply device configured to supply DC power to a load, comprising:
    a shunt resistor connected in series to a low-potential side of the load;
    a power supply control device for controlling a power supply state to the load according to an amount of a voltage drop across the shunt resistor and supplying a drive current;
    a ground fault detection element connected in series to the low-potential side of the load to cause a voltage drop, the ground fault detection element receiving the drive current and a detection current, which is different from the drive current; and
    a limiting device for determining whether an amount of the voltage drop, which occurs when the detection current flows through the ground fault detection element, is less than a predetermined threshold, and when the voltage drop is less than the predetermined threshold, limiting a supply of power by the power supply control device by determining that the ground fault occurs.

2. The power supply device according to claim 1, wherein:
    the ground fault detection element is connected in series to a high-potential side of the shunt resistor.

3. The power supply device according to claim 1, wherein:
    the ground fault detection element is a diode whose anode side is connected to the low-potential side of the load.

4. The power supply device according to claim 3, further comprising:
    a switching element connected in parallel to the diode; and
    a control device for (i) controlling the switching element to turn on when power is supplied to the load, and (ii) controlling the switching element to turn off when a supply of power to the load is stopped.

5. The power supply device according to claim 1, wherein:
    the ground fault detection element is a switching element; and
    the power supply device further comprising:
    a control device for (i) controlling the switching element to turn on when power is supplied to the load, and (ii) controlling the switching element to turn on in a high-impedance state in comparison with a state while power is supplied, when a supply of power to the load is stopped.

6. The power supply device according to claim 5, wherein:
    the control device controls the switching element to turn off when it is determined that an excess current is applied to the load.

7. The power supply device according to claim 1, wherein:
    the ground fault detection element is a field effect transistor;
    the field effect transistor is connected in such a manner that an anode side of a parasitic diode of the field effect transistor is positioned on a side of the load; and
    the power supply device further comprising:
    a control device for (i) controlling the field effect transistor to turn on when power is supplied to the load, and (ii) controlling the field effect transistor to turn off when a supply of power to the load is stopped.

8. The power supply device according to claim 1, wherein:
    when a need to put the load into operation is raised, the limiting device detects an amount of the voltage drop before power is supplied to the load from the power supply control device, and allows the power supply control device to supply power when a detected amount of the voltage drop is as large as or larger than the threshold.

9. The power supply device according to claim 8, further comprising:
    a detection current output circuit that outputs the detection current to the ground fault detection element.

10. The power supply device according to claim 8, wherein:
    the detection current is outputted from the power supply control device to the ground fault detection element through the load.

11. The power supply device according to claim 1, further comprising:
    a changing device for changing the threshold to a large value while power is supplied to the load in comparison with the threshold used, when a supply of power to the load is stopped.

12. The power supply device according to claim 1, wherein:
    the shunt resistor and the ground fault detection element are connected in series to the low-potential side of the load, the ground fault detection element being positioned at a lower potential side of the shunt resistor;
    the power supply control device detects the amount of the voltage drop across the shunt resistor;
    the limiting device detects the amount of a voltage drop across both of the ground fault detection element and the shunt resistor; and
    the detection current flows through the ground fault detection element at a time when the drive current does not flow through the load.

13. A power supply device configured to supply DC power to a load, comprising:
    a shunt resistor connected in series to a low-potential side of the load;
    a power supply control device for controlling a power supply state to the load according to an amount of a voltage drop across the shunt resistor;
    a ground fault detection element connected in series to the low-potential side of the load to cause a voltage drop; and
    a limiting device for limiting a supply of power by the power supply control device by determining that a ground fault occurs in a case where the amount of the voltage drop, which occurs when a detection current flows through the ground fault detection element, is less than a predetermined threshold, wherein:

the ground fault detection element is a diode whose anode side is connected to the low-potential side of the load; and the power supply device further comprises:
- a switching element connected in parallel to the diode; and
- a control device for (i) controlling the switching element to turn on when power is supplied to the load, and (ii) controlling the switching element to turn off when a supply of power to the load is stopped.

14. A power supply device configured to supply DC power to a load, comprising:
- a shunt resistor connected in series to a low-potential side of the load;
- a power supply control device for controlling a power supply state to the load according to an amount of a voltage drop across the shunt resistor;
- a ground fault detection element connected in series to the low-potential side of the load to cause a voltage drop; and
- a limiting device for limiting a supply of power by the power supply control device by determining that a ground fault occurs in a case where the amount of the voltage drop, which occurs when a detection current flows through the ground fault detection element, is less than a predetermined threshold, wherein:

the ground fault detection element is a switching element; and the power supply device further comprises:
- a control device for (i) controlling the switching element to turn on when power is supplied to the load, and (ii) controlling the switching element to turn on in a high-impedance state in comparison with a state while power is supplied, when a supply of power to the load is stopped.

15. The power supply device according to claim 14, wherein:
the control device controls the switching element to turn off when it is determined that an excess current is applied to the load.

16. A power supply device configured to supply DC power to a load, comprising:
- a shunt resistor connected in series to a low-potential side of the load;
- a power supply control device for controlling a power supply state to the load according to an amount of a voltage drop across the shunt resistor;
- a ground fault detection element connected in series to the low-potential side of the load to cause a voltage drop; and
- a limiting device for limiting a supply of power by the power supply control device by determining that a ground fault occurs in a case where the amount of the voltage drop, which occurs when a detection current flows through the ground fault detection element, is less than a predetermined threshold, wherein:

the ground fault detection element is a field effect transistor;

the field effect transistor is connected in such a manner that an anode side of a parasitic diode of the field effect transistor is positioned on a side of the load; and the power supply device further comprises:
- a control device for (i) controlling the field effect transistor to turn on when power is supplied to the load, and (ii) controlling the field effect transistor to turn off when a supply of power to the load is stopped.

17. A power supply device configured to supply DC power to a load, comprising:
- a shunt resistor connected in series to a low-potential side of the load;
- a power supply control device for controlling a power supply state to the load according to an amount of a voltage drop across the shunt resistor;
- a ground fault detection element connected in series to the low-potential side of the load to cause a voltage drop; and
- a limiting device for limiting a supply of power by the power supply control device by determining that a ground fault occurs in a case where the amount of the voltage drop, which occurs when a detection current flows through the ground fault detection element, is less than a predetermined threshold, wherein:

when a need to put the load into operation is raised, the limiting device detects an amount of the voltage drop before power is supplied to the load from the power supply control device, and allows the power supply control device to supply power when a detected amount of the voltage drop is as large as or larger than the threshold.

18. The power supply device according to claim 17, further comprising:
a detection current output circuit that outputs the detection current to the ground fault detection element.

19. The power supply device according to claim 17, wherein:
the detection current is outputted from the power supply control device to the ground fault detection element through the load.

* * * * *